United States Patent [19]

Lindberg et al.

[11] Patent Number: 5,663,967
[45] Date of Patent: Sep. 2, 1997

[54] DEFECT ISOLATION USING SCAN-PATH TESTING AND ELECTRON BEAM PROBING IN MULTI-LEVEL HIGH DENSITY ASICS

[75] Inventors: Grant A. Lindberg, Santa Clara; Sharad Prasad, Peasanton; Kaushik De, San Jose; Arun K. Gunda, Sunnyvale, all of Calif.

[73] Assignee: LSI Logic Corporation, Milpitas, Calif.

[21] Appl. No.: 545,462

[22] Filed: Oct. 19, 1995

[51] Int. Cl.⁶ ............................................ G01R 31/28
[52] U.S. Cl. .................................... 371/26; 371/22.31
[58] Field of Search ........................ 371/26, 22.1, 22.3, 371/27

[56] References Cited

U.S. PATENT DOCUMENTS

| | | | |
|---|---|---|---|
| 4,012,625 | 3/1977 | Bowen et al. | 235/153 |
| 4,228,537 | 10/1980 | Henckels et al. | 371/23 |
| 5,291,495 | 3/1994 | Udell, Jr. | 371/22.3 |
| 5,293,387 | 3/1994 | Booth | 371/26 |
| 5,475,624 | 12/1995 | West | 371/26 |

*Primary Examiner*—Hoa T. Nguyen
*Attorney, Agent, or Firm*—Katz & Cotton, LLP

[57] ABSTRACT

A method and apparatus for isolating faults in an integrated circuit reduces time and effort to precisely locate such faults. A fault dictionary is developed, which is a record of the errors a circuit's modeled faults are expected to cause. The fault dictionary need only be generated once, and can be recalled for later testing of the same design. A failing circuit is subjected to test vectors and the erroneous outputs are logged, and then all failing scan test vectors are mapped into simulation scan patterns. Faults in the circuit are localized to a more narrowly defined area in which faults in the circuit may occur. If the area, even after localization, is too large, additional test patterns are developed and the device is subjected to another round of tests. The redefinition of test patterns is repeated until possible fault locations are sufficiently localized. The device is then probed to precisely locate the fault(s).

4 Claims, 6 Drawing Sheets

| VECTOR | fa | fb | fc | fd | fe | ff | ... |
|--------|----|----|----|----|----|----|-----|
| . | | | | | | | |
| . | | | | | | | |
| . | | | | | | | |
| 29 | X | X | | X | | X | |
| 30 | X | X | | | | X | |
| 31 | X | X | | | | | |
| 32 | | X | | | | | |
| 33 | | | | | | | |
| . | | | | | | | |
| . | | | | | | | |
| . | | | | | | | |

FAULT DICTIONARY

FIGURE 3

| VECTOR | latch0 | latch1 | latch2 | ... | po1 | po2 | po3 | ... |
|--------|--------|--------|--------|-----|-----|-----|-----|-----|
| 11 | X | | | | | | | |
| 29 | X | X | | | X | | X | |
| 32 | | X | | | | | | |
| 33 | X | X | | | | | | |
| 37 | X | | | | | | X | |

DATALOG MAPPED TO STANDARD FORMAT

FIGURE 4

SIMPLIFIED REPRESENTATION OF A SCAN-CHAIN
FIGURE 5

BACKTRACE CONES
FIGURE 6

FIGURE 7

DEFECT ISOLATION USING SCAN-PATH TESTING AND ELECTRON BEAM PROBING IN MULTI-LEVEL HIGH DENSITY ASICS

FIELD OF THE INVENTION

The present invention relates generally to the field of integrated circuit testing and, more particularly, to a method and apparatus for the isolation of defects in multi-level, high density, application-specific integrated circuits.

BACKGROUND OF THE INVENTION

Competing demands on integrated circuit manufacturers require them to reduce costs while maintaining the quality of their products. Consequently, manufacturers and designers have expended great effort in developing testing techniques to minimize the number of defective products shipped to customers. Such testing techniques include certain "pass/fail" tests on a sampling of semiconductor products prior to shipment to detect the presence of a defect in the products.

However, cost reduction also requires elimination of the causes of defects in order to improve manufacturing yield. Hence, semiconductor manufacturers must screen for defective parts, as well as identify the reasons and locations of defects in the defective parts so that appropriate changes can be made in the design and processing of the semiconductor products to reduce the incidence of such defects or faults.

The most common fault model used in the testing community is the "stuck-at" fault model. The stuck-at fault model assumes that a defect in an integrated circuit behaves like a node in the circuit that is stuck-at-1 or stuck-at-0. Although most of the possible defects in an integrated circuit can be modeled by using this fault model, there are some exceptions. One of the noted exceptions is the bridging fault, i.e., shorting between two signal lines in the physical layout.

To ascertain a functional fault in an integrated circuit, electron beam probing is a powerful technique for analyzing the functional fault. A common approach used for isolating these defects is to back trace an incorrect signal on a failing pin through the circuit, by probing each node. The inputs and outputs of each logical node can be compared against simulated results to determine functionality. However, this method has several limitations. Most notably, this back-tracing method is often an extremely time consuming process. In order to reduce the time required for back-tracing defect isolation, scan-path design,s have been introduced which increase the observability and controllability of internal circuit nodes. The use of application specific integrated circuit (ASIC) scan-path architecture is increasing due to the improved testability compared to non-scan designs. Scan-path architecture also offers opportunities for more efficient failure analysis of functional faults.

Electron beam probing is based on the principle of "voltage-contrast imaging." A failing device is mounted in a vacuum chamber and an image is generated by raster scanning a beam of electrons over the surface of the device. When the beam impacts the surface of the device, secondary electrons are generated and can be detected. The detection mechanism produces a real-time image of the surface of the device on a computer monitor. Areas of the device which are at zero or low voltages appear lighter since more secondary electrons are generated. Those areas which are more positive in voltage appear darker since those areas emit fewer secondary electrons. An additional feature, analogous to a sampling oscilloscope, allows the user to acquire waveforms at selected points on the surface of the device.

To determine the failure location, the device is mounted on a tester which subjects the device to predetermined signals, referred to as test vectors or vectors. Certain signals or vectors will "pass" and certain signals or vectors will "fail," even in most faulty circuits. The test head is then docked with the electron beam prober. A loop of vectors, including the failing vector or vectors, is then established, and the electron beam prober is synchronized to the looping frequency of the tester. Beginning at a failing bond pad, waveforms are acquired using the electron beam prober and compared with simulated waveforms created from design of the device. Using this technique, an analyst backtraces through the logic, comparing the inputs and outputs of each cell with the simulation waveforms. Eventually, a cell will be located which has correctly functioning inputs and an incorrect output. Internal probing of the faulty cell and additional techniques including stroboscopic imaging are often sufficient to precisely locate the defect.

The use of multiple layers of metalization and ever-increasing circuit densities have introduced additional difficulty in the timely analysis of functional failures. Furthermore, failure analysts are often unfamiliar with the circuit design of an ASIC and may have limited access to design personnel to assist with the analysis.

With higher circuit densities and multi-layers of metalization, the backtracing method of locating defects using an electron beam prober has become increasingly difficult. The number of nodes which must be probed can be prohibitive-locating a faulty cell often requires the analyst to probe tens or hundreds of cells which is extremely time consuming. Multi-layer metalization requires additional sample preparation in order to probe lower levels. Although it is possible to probe conductors through the dielectric layers, the signal quality degrades with increasing dielectric thickness. To obtain better signals, portions of the dielectric layers are removed using a plasma or reactive ion etch. In certain cases; it is necessary to create probe points; however, this method can be time consuming if it is required at a large number of nodes.

Furthermore, simulation of waveforms using design software has become computer time intensive. For devices with high gate counts, it is not feasible to simulate all of the internal waveforms simultaneously. Instead, current procedures probe a small number of cells and simulate the relevant waveforms for comparison. This method is repeated—probing and simulating a small number of cells at a time—until the faulty cell is located.

These limitations with backtracing have led to increasingly lengthy cycle times, and have driven the need for a more efficient method for locating functional defects.

There also remains a need for a system and method for the isolation of defects in integrated circuits that combine the defect simulation on the tester, with subsequent beam probing, to reduce the number of nodes that must be probed. The system and method should further include a means of iteratively reducing the number of nodes for testing by repeating the scan-path testing, until a manageable number of nodes has been identified.

SUMMARY OF THE INVENTION

The present invention solves these and other shortcomings of the prior art by providing a method of defect isolation using scan-path testing in conjunction with electron beam probing. Using this method, a fault area or node is identified using a test datalog, and the defect is precisely located using an electron beam probe station. The present invention provides the integration of scan testing with electron beam probing for isolating various defects on devices with multiple layers of metalization, as well as high densities of usable gates and scan elements.

In response to the problems with the current backtracing approach, the present invention provides a methodology which takes advantage of the increasing trend of ASICs which incorporate scan-path architecture.

In the present invention, a fault dictionary is developed, which is a record of the expected errors from predefined faults in a circuit model and a given set of test vectors. In other words, a fault dictionary is a record of the behavior of a given circuit under different fault combinations. The fault dictionary need only be generated once, and can be recalled for use testing of a circuit having the same design. When a circuit under test is subjected to these test vectors, any erroneous outputs generated by faults in the circuit are logged into a datalog, and then from the datalog all of these erroneous outputs are mapped into simulation scan patterns. From the mapped simulation scan patterns, the logged erroneous outputs are used to define a more localized area in which the faults in the circuit may have occurred. If the localized area is too large, then additional test vectors may be used to better define a smaller localized area. More test vectors may continue to be applied to the circuit under test to generate more erroneous outputs which are logged into the datalog and mapped into additional simulation scan patterns. In this way, the additionally logged erroneous outputs are used to better define a still smaller localized area. Once a sufficiently small localized area has been defined, the circuit under test may be probed with the electron beam probe to precisely locate the fault(s).

These and other features and advantages of the present invention will be apparent to those of skill in the art from a review of the following detailed description along with the accompanying drawing figures.

A preferred embodiment of the present invention is a method and apparatus for isolating a circuit defect in an integrated circuit device. The present invention accomplishes this end by creating a fault dictionary of faults anticipated from specific scan patterns for the integrated circuit device, then mapping all failing scan test vectors from a faulty integrated circuit into simulation scan patterns. Next a scan integrity test is performed on sequential circuitry defining a scan chain in the integrated circuit device and, if the scan integrity test fails, then probing the scan chain to isolate the fault with an electron beam prober. If the scan integrity test passes, then provide the simulation scan patterns to a diagnostic fault simulator. The fault simulator creates a list of suspect faults in the combinational logic of the integrated circuit device to be used to localize possible fault locations in the integrated circuit device. If the number of entries in the list of suspect faults is less than or equal to a desired number, then the combinational logic is probed with an electron beam to locate the fault(s) while diagnostic test patterns are being run in the integrated circuit device under test. If the number of entries in the list of suspect faults is larger than the desired number, then additional test patterns are run on the integrated circuit device to further localize faults therein until the number of entries in the list of suspect faults is less than or equal to the desired number. Once the number of entries in the list of suspect faults is less than or equal to the desired number, then the combinational logic is probed with an electron beam to locate the fault(s) while diagnostic test patterns are being run in the integrated circuit device under test.

DETAILED DESCRIPTION OF A PREFERRED EMBODIMENT

Figure 7:
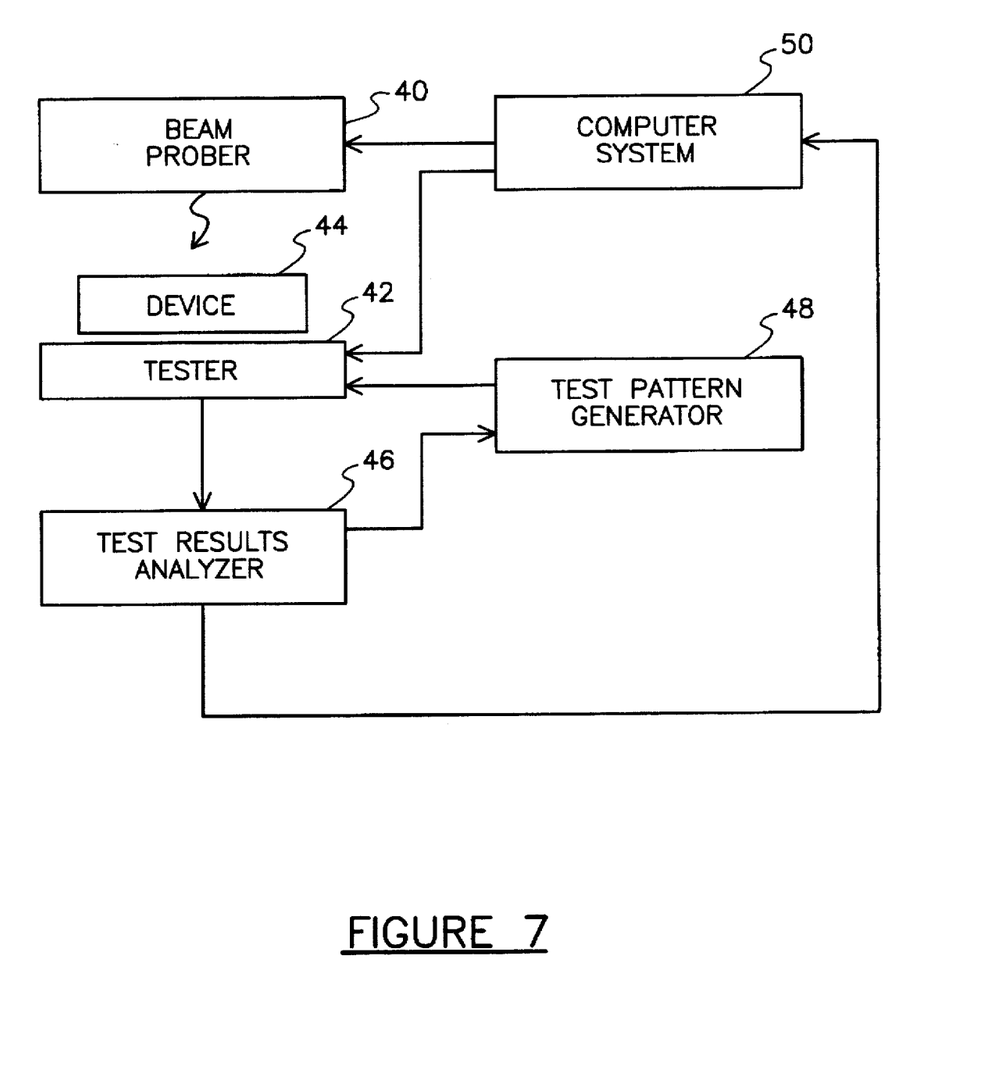
FIG. 7 is an overall schematic diagram of the system of the present invention.

Referring first to FIG. 7, the system of the present invention comprises. primarily a beam prober 40, a tester 42 wherein is placed a device 44 under test, an analyzer 46 to analyze and review the results of the test from the tester 42, and a test pattern generator. The functions of the various components are explain below in greater detail.

Figure 1:
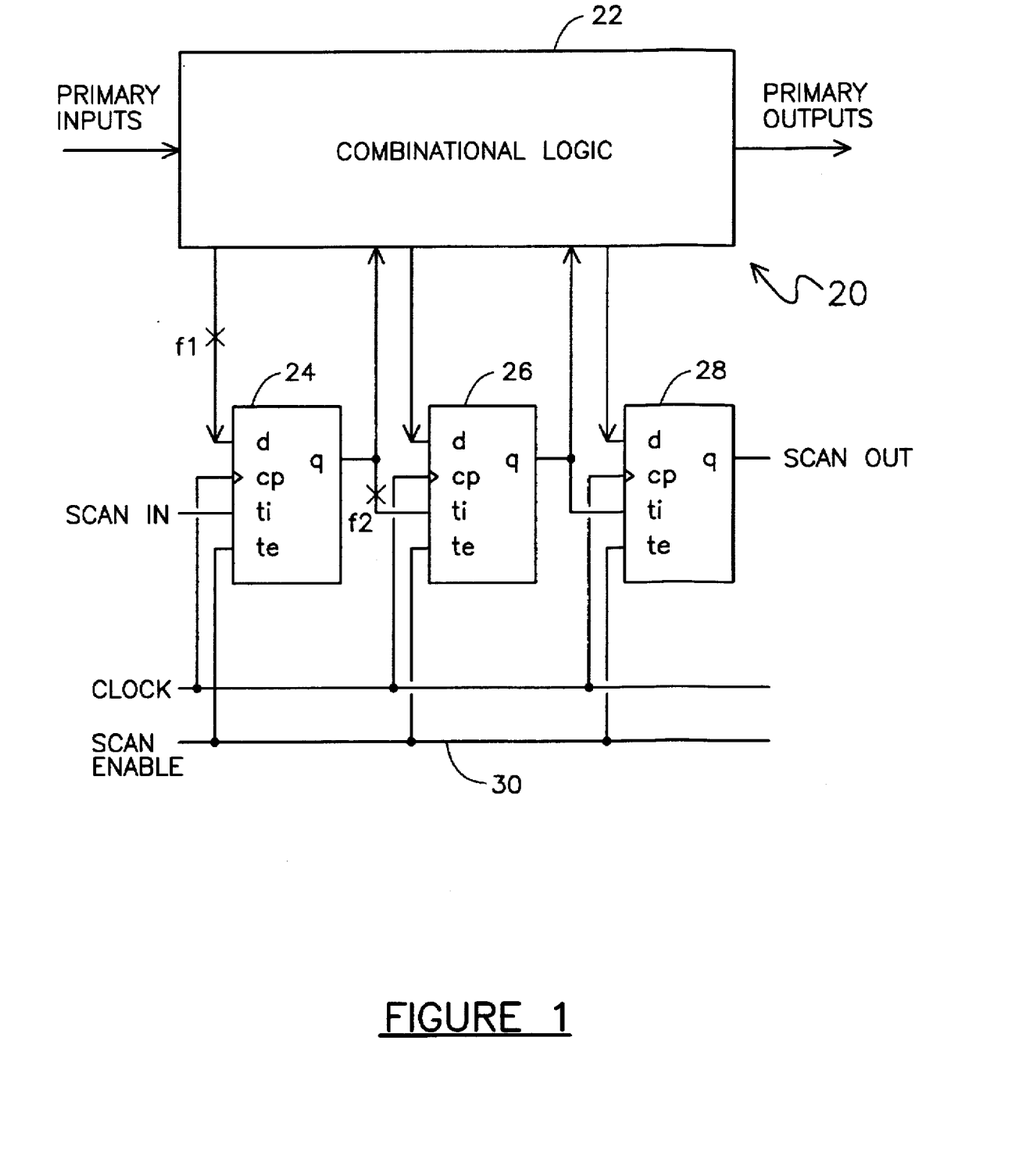
FIG. 1 is a schematic representation of an implementation of a scan-path.

As background, FIG. 1 is a simplified schematic representation of one of many possible implementations of a scan-path 20, in which the present invention finds application. The circuit of the schematic comprises primarily combinational logic 22 and a number of latches or flip-flops 24, 26, and 28, as well as the various inputs, control lines, and a clock input.

With a scan design, all flip-flops are replaced by their scan equivalents. During normal system operation, the scan enable 30 signal at input $t_e$ is not asserted, and the latches behave as their non-scan equivalents. When the chip is being tested, scan enable 30 is asserted, and data is clocked serially into the latches (which form a shift register) via a scan input pin $t_i$.

To test the scan latches, patterns of 1's and 0's can be shifted in through the scan chain at the scan input pin $t_i$ to the scan output. To test the combinational portion of the circuit, the scan enable pin $t_e$ is enabled and a test pattern is shifted serially into the latches. A clock pulse is applied after disabling the scan enable pin $t_e$, allowing time for the combinational logic to stabilize. The scan enable pin $t_e$ is then re-asserted and the latch values are shifted out of the circuit.

The inclusion of a scan-path offers increased controllability and observability of internal nodes. This architecture makes it possible to condition nodes to specified states and to observe those states. Vectors can be created which are simpler, yet achieve greater fault coverage than with non-scan designs. The growing popularity of ASIC scan-path designs is due to this improved testability and also to the relative ease of implementation.

There are a variety of known software programs which aid design engineers in creating and verifying scan-path circuits and test vectors. Another benefit of scan-path designs is their potential to reduce the cycle times to detect and define functional failures. Through the judicious use of scan test patterns and datalogs, it is possible to generate a list of suspect faults. From the list of suspect faults, a failure location, such as fault site $f_1$ or $f_2$, can then be identified from the list of suspect faults using a diagnostic tool such as an electron beam prober. However, those of skill in the art will appreciate that increasing complexity of the circuit makes this approach inefficient since literally hundreds of possible fault or failure locations may be identified by the scan test.

Figure 2:
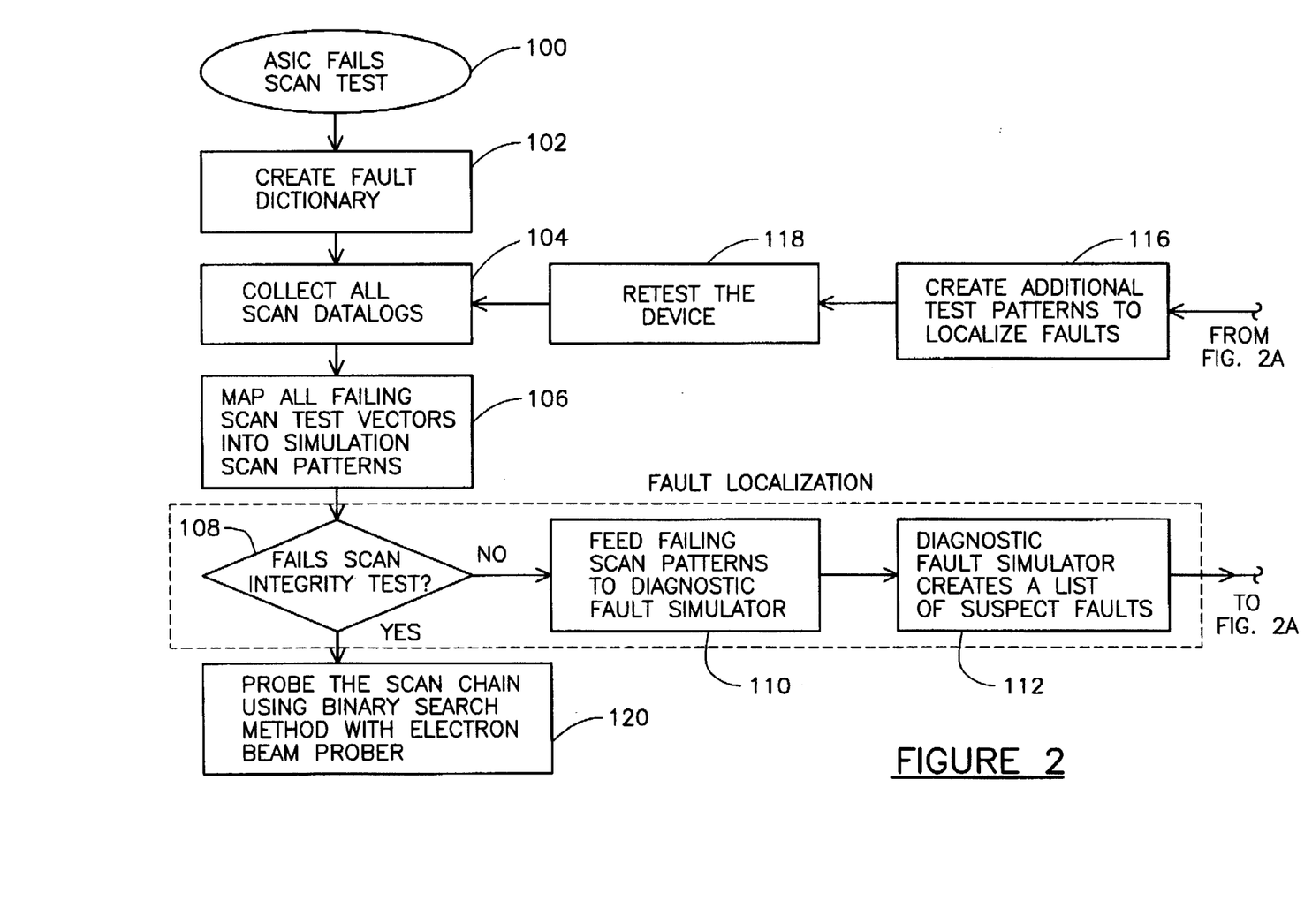
FIGS. 2 and 2A are, a logic flow diagram of the method of the present invention.
Figure 2A:
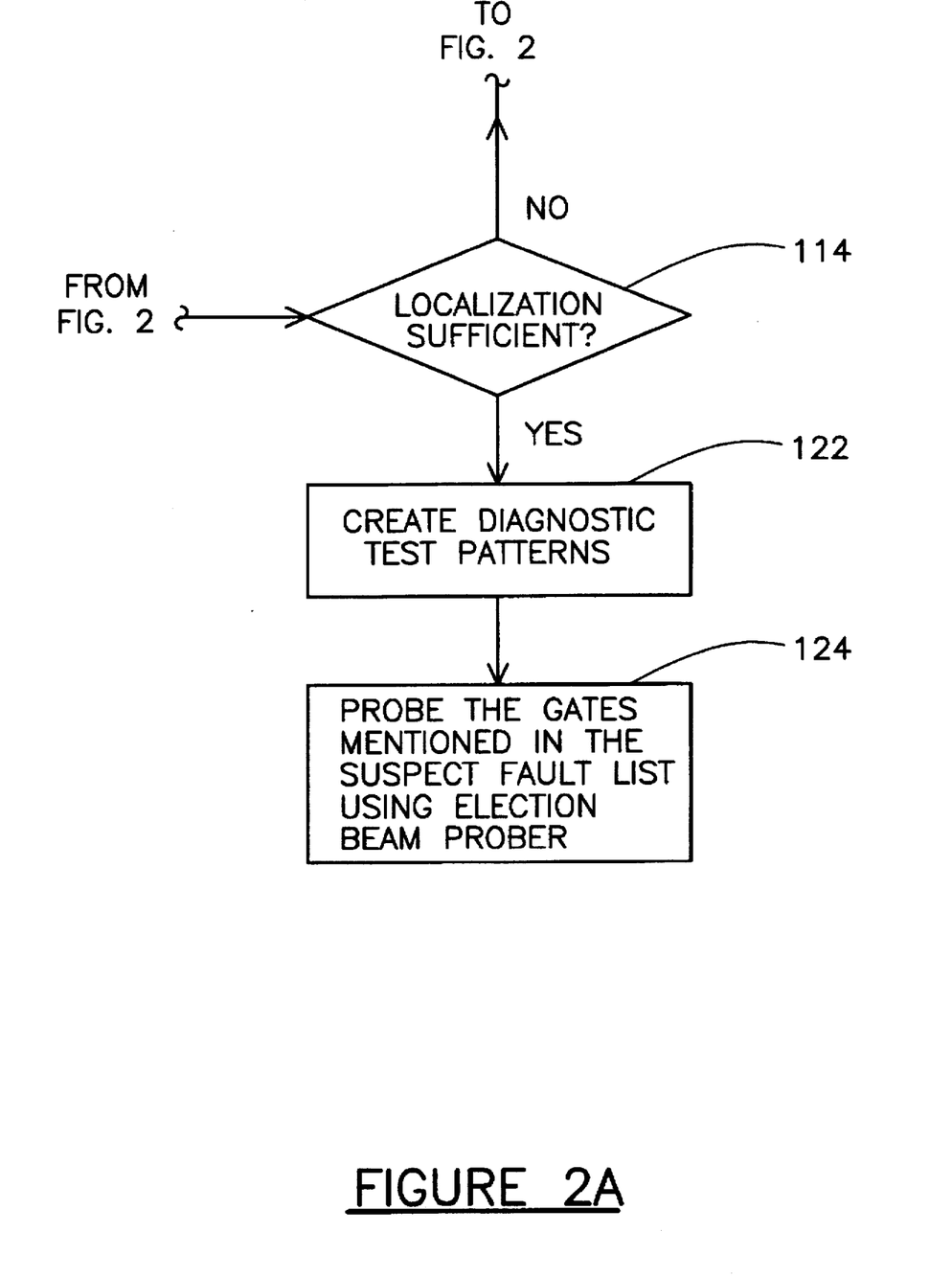

The present invention provides a technique for testing a circuit to localize possible fault or failure, determining if the possible fault or failure are sufficiently localized for efficient electron beam probing and, if not, creating additional test patterns to more particularly localize the possible fault or failure locations. A methodology of the present invention based on this approach is illustrated in FIGS. 2 and 2A.

The process begins at step 100, in which an integrated circuit chip has failed a scan test. For example, ASIC circuit chips are routinely tested for satisfaction of a "go/no-go" test and, if the chip fails such a test, may then be provided to the system of the present invention to isolate the possible fault or failure locations.

Figure 3:
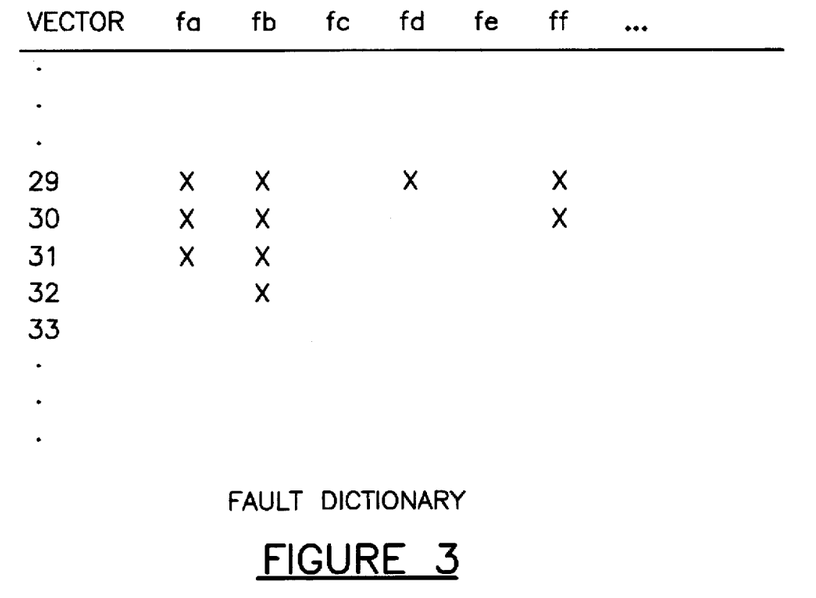
FIG. 3 is an exemplary fault dictionary.

In step 102, for purposes of failure analysis, a complete fault dictionary is also required which identifies all of the possible fault or failure locations that each test vector can detect. FIG. 3 depicts an example of such a fault dictionary. For example, vector 29 detects faults $f_a$, $f_b$, $f_d$, and $f_f$. Since this process requires a considerable amount of computer time and storage resources, it is not normally run until it is required for failure analysis. Once a fault database has been generated, it can be stored and de-archived as required.

The next step, step 104, collects a list of test vectors in a datalog that cause scan block failures in the integrated circuit device under test. The test vectors are applied to the integrated circuit device under test with an integrated circuit device tester in a manner known to those skilled in the art of integrated circuit testing. It is preferable that as many as practical of the test vectors causing scan block failures be stored in the datalog. The fault simulator uses each of the test vectors in the datalog to produce a list of possible fault or failure locations. If not enough of the test vectors causing scan block failures are data logged, the list of possible fault or failure locations may be too ambiguous because the possible fault or failure location resolution is limited.

Figure 4:
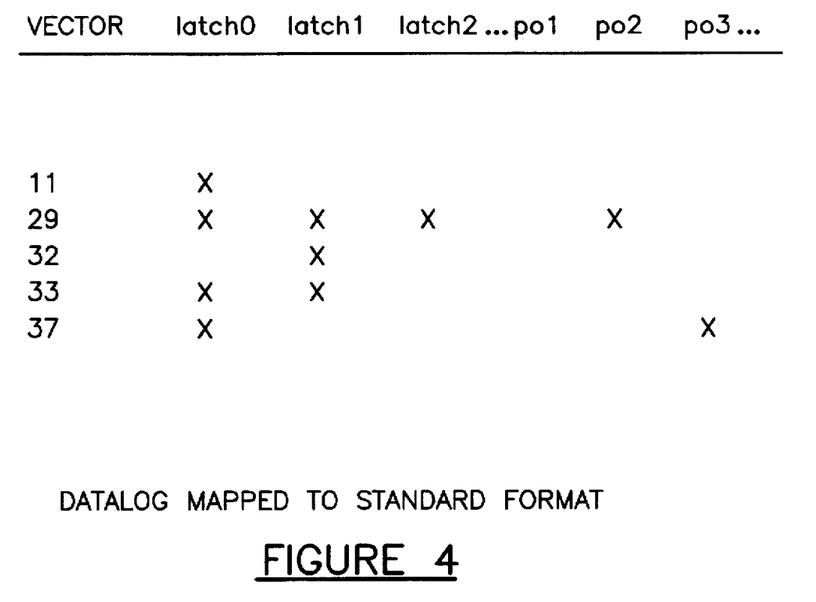
FIG. 4 is an exemplary datalog mapped to a standard format.

The test vectors causing the erroneous outputs are mapped into simulation scan patterns into a standard format, as illustrated in step 106, of FIG. 2. The simulation scan patterns now include the vector numbers, the failing latch (es) and the failing outputs (FIG. 4). As illustrated in FIG. 4, vector 37 failed at latch0 and po3. The failure at po3 (primary output 3) will be observed and logged immediately after data is scanned into the device and the system clock is applied. The failure at latch0, however, will not be observed and logged until after its value is scanned out of the device. Since the latch failure and the primary output failure are logged separately, the mapped simulation scan patterns are is used to associate both of these failures with the appropriate test vector, as illustrated in FIG. 4.

There are two distinct types of functional failures which require different failure analysis approaches: (1) faults which occur directly in the scan-path and (2) faults which occur in the combinational portion of the scan-path.

Referring again to FIG. 1, fault $f_2$ is an example of a fault which occurs directly in the scan-path. If the node is stuck-at-one, a series of 1s will be scanned out of the device. Normally, the integrity of the scan-path is checked by shifting a string of 1s and 0s through the latches prior to the testing of the combinational logic.

In contrast, $f_1$ is an example of a fault which occurs in the combinational portion of the scan-path. In this case, the fault occurs at an output from the combinational portion of the scan-path. If the fault is stuck-at-one, vectors which expect a zero at the output of latch 24 will fail.

Step 108 (FIG. 2) performs the scan integrity test. The scan integrity test checks the path between the Scan In pin and the Scan Out pin; the device will either pass or fail the entire vector set. The datalog cannot be, used to isolate the failing location, since a stuck-at-1 (or stuck-at-0) fault will cause the same failure regardless of where it is located.

To perform the scan integrity check, a scan pattern of alternating 1's and 0's is simply shifted through the scan chain, with no system clock applied. The data at the Scan out pin is compared with the scan input data. If any fault is detected, then the process continues with step 120.

Figure 5:
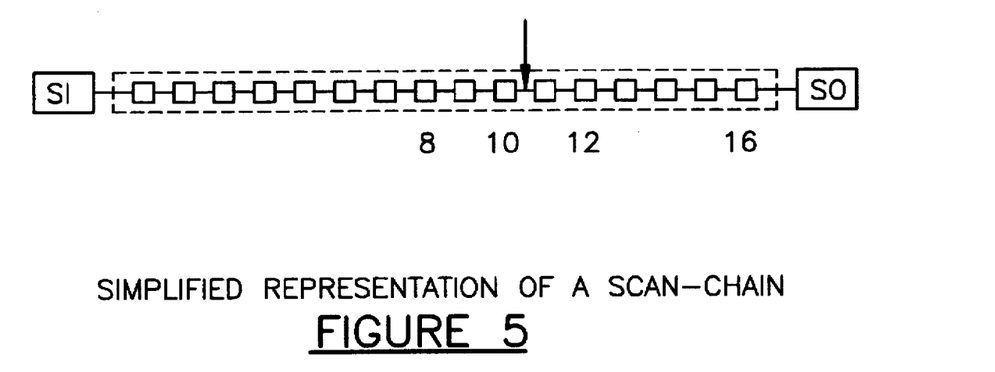
FIG. 5 is a simplified schematic diagram of a scan-chain.

To identify the failing location, a binary search is conducted in step 120 using an electron beam prober. FIG. 5 depicts a simplified representation of a scan chain with a failure at the indicated location. The failing device is mounted on the prober and a looping pattern of 1s and 0s is scanned into the device. Since there are 16 latches in this example, the analyst would initially probe the output of latch 8 to determine the presence of a signal. In this case a signal would be present, and latch 12, where a signal would be absent, would be probed next. The analyst would continue probing latches in this manner, moving forward toward the output of the scan-chain when a signal is present, moving backward when a signal is absent, each time reducing the movement step by half. In this example, latches 8, 12, 10, and 11 would be probed until the fault between latch 10 and 11 was located.

In general, the maximum number of locations which must be probed by the analyst is $\log_2 n$; where n is the number of elements in the scan-path. If there are 1024 elements in the scan chain, for example, a maximum of 10 locations need to be probed to locate the fault. Once the fault is located, additional internal probing of a failing latch may be required.

In a normal scan-path design, the scan elements will not be arranged in an orderly manner as illustrated in FIG. 5. To facilitate the binary search, the analyst is provided with a list of the nets corresponding to the latch outputs ordered by their location in the chain. The appropriate net name can be entered by the analyst into the electron beam prober's navigational software, which identifies the corresponding location of the ASIC's layout.

Faults which occur in the combinational portion of a scan design are more common than those which occur directly in the scan-path, since there are normally more elements in this portion of the circuit. Combinational faults are also more difficult to isolate than those directly in the scan-path. Diagnostic software is used to assist the analyst in this process. Each of the test vector causing both failing and passing suspect fault locations have been localized with sufficient particularity are processed by the diagnostic software to identify a list of suspect fault locations which can then be verified by an electron beam prober.

Figure 6:
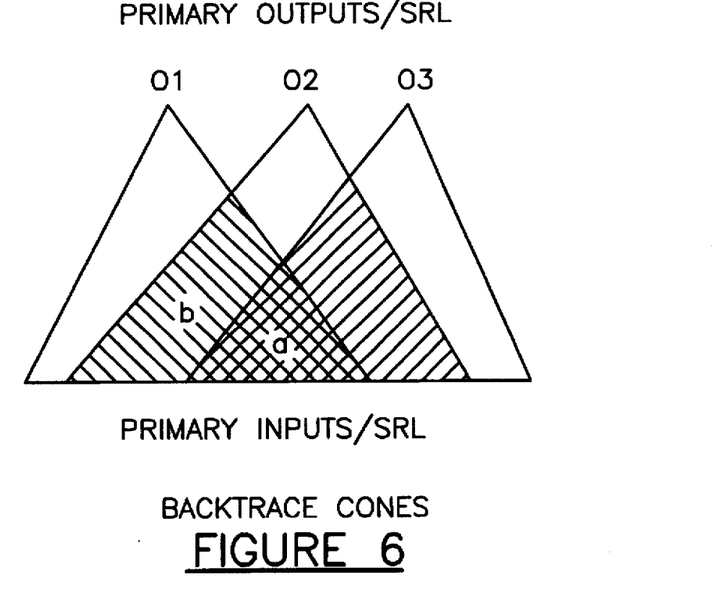
FIG. 6 is a schematic diagram of a set of backtrace cones.

FIG. 6 depicts the concept of a backtrace cone. A backtrace cone includes all of the circuit components that may impact a particular output, i.e., the set of gates which begin at a failing output and terminate at a primary input and latch boundaries.

Beginning with the first failing vector, all of the failing vectors are processed in the following manner. The diagnostic software determines the backtrace cone of each of the primary outputs and latches which fail the vector. For example, consider a case where vector 29 fails outputs $O_1$, $O_2$, and $O_3$. The backtrace cones for this vector are illustrated in FIG. 6. If a single fault-scenario is assumed, only those faults which occur in the intersection of all of the backtrace cones are possible defect locations, since faults outside the intersection would not cause all of the outputs and latches to fail. Faults which occur in region a and are detected by vector 29 could explain all three failing outputs.

Faults which occur outside of the intersection of the backtrace cones, region b for example, can explain the failure of $O_1$ and $O_2$ but can't account for $O_3$. Therefore, faults in region b can be eliminated from the list of suspect faults, if a single structural fault is assumed.

To this point, the device under test fault model has assumed a single stuck-at fault, either stuck-at 1 or stuck at 0. A more complete device under test model takes into account the possibility of multiple faults or defects. In this case, it is not valid to eliminate faults outside of the intersection of all of the backtrace cones, instead, faults are given a weight by the diagnostic software according to how many backtrace cones they intersect. Accordingly, in FIG. 6, faults in region a would be given a higher weight than those in region b. The weights to be accorded are preferably user selectable.

Under the single-fault assumption, any fault which is detected by a passing vector can be removed from the suspect fault list. For example, referring now to FIG. 4, it is implicit that vector 30 passes since it is not contained in the datalog. Referring to the fault dictionary (FIG. 3), vector 30 identifies faults $f_a$, $f_b$, and $f_f$ since vector 30 passes, these faults can be removed from the suspect list.

In a multiple-faults scenario, faults cannot be removed in this manner. For example, although fault $f_b$ is in the list of faults that can be detected by the vector 30, it does not mean that fault $f_b$ can be removed from the list. The effect of fault $f_b$ may be masked out by another fault. As a result, the pattern which is supposed to detect fault $f_b$ will not detect it. If a multiple-fault scenario is assumed, the fault list cannot be reduced further. Instead, faults are weighted according to how many passing patterns they are detected by.

It is impractical to perform fault simulation which takes into account all possible multiple stuck-at faults. The fault localization method of the present invention is based on a single stuck-at fault model. However, certain heuristics, including the process of weighting defects, are incorporated to account for the possibility of multiple-defects. When the diagnostic process is complete, a list of nodes is produced, ordered according to their probability of occurrence. A suspect list is generated based on a probability threshold determined by the user. The size of the suspect list can be changed by adjusting the probability threshold.

At this point, step 114 (FIG. 2A) of the process determines whether the suspect fault locations have been localized with sufficient particularity. If the suspect fault list is large, then a new set of is patterns are generated in step 116 and the whole procedure from testing in step 118 to mapped simulation scan patterns in step 104 to fault localization in steps 108, 110, and 112 is repeated. The new scan patterns serve as the verification patterns necessary to further localize and verify the defects indicated by the faults in the suspect fault list. To further localize the faults, each newly created pattern targets one specific suspected fault. A fault may be detected by more than one scan pattern. The diagnostic fault simulator software program attempts to identify the pattern which detects a minimum number of other faults in the suspected fault list.

There is an overall time limit for the test generation to distinguish the suspect fault list. Note that generating the new scan patterns to target one specific fault has a different purpose than that of generating the production scan patterns, which are optimized (compacted) to detect as many independent faults as possible.

Once the diagnostic software has reduced the suspect fault list to a manageable number, the actual failure location is then verified using a electron beam prober. To assist with the verification process, the diagnostic software generates test patterns which toggle suspect nets by alternately inserting logic 1's and 0's.

The diagnostic test patterns in step 122 are looped and a trigger is established from the tester to the electron beam prober. Depending on the electron beam prober used, there may be constraints on the size of the test loop, and the speed of the scan clock may need to be adjusted accordingly.

The device is mounted on the electron beam prober and the suspect nets are probed to determine which of the nets are toggling according to step 124. The key to a timely verification of suspect nets is the use of the appropriate navigational tools. An ASIC's layout database is processed into a format that is compatible with the electron-beam prober software and a corresponding netlist is extracted. The layout is then aligned and locked to the scanning electron microscopic image of the ASIC.

Each of the suspect nets can then be rapidly located by the analyst by selecting the appropriate netlist using the electron beam prober software. When a net is identified which does not toggle in response to a stimulus pattern, the inputs to the cell whose output drives the net are probed to determine whether they are functioning correctly. If the inputs to a cell are functioning correctly and the output is not toggling, internal probing of the cell is performed to precisely locate the fault.

The scan failure analysis method and system of the present invention have three main advantages over the known backtracing failure analysis approach.

First, the number of cells which must be probed by the analyst is greatly reduced. This significantly reduces the most time consuming part of failure analysis. It is important to note that the diagnostic software may not identify a single fault location. Rather, it may generate a list of suspect faults. Determining the exact fault location requires the use of the electron beam prober to precisely locate the defect location. In comparison with known backtracing techniques, however, the number of cells which must be probed is significantly reduced, and the analyst can proceed directly to each of the suspect nets. Using this method, defects have been located in less than fifteen minutes by probing a small number of nets. Locating similar defects using backtracing techniques typically involves days or weeks of probing and simulation of tens or hundreds of nets.

Next, failure analysis does not require the use of design simulation waveforms. Using the previous backtracing approach, the waveforms at each node are probed and compared against simulation waveforms to determine the functionality of cells and to identify paths for further probing. Using the scan failure analysis method and system of the present invention, suspect nets are identified prior to electron beam probing, and test patterns are generated which drive the nets into specified states. Comparison with simulation waveforms is not required. There is additional work required in the creation of the fault dictionary and the process of the datalog by the diagnostic software; however, this has been found to be considerably less time consuming than node by node waveform simulation. In addition, this work can be done prior to the use of the electron beam prober, which leads to a more efficient use of the equipment without the periodic resimulation of waveforms.

The need for techniques such as probe point creation, required when it is difficult to probe a specific net is reduced. With scan failure analysis the number of nodes which must be probed is limited, and hence the need for probe points is reduced.

The principles, preferred embodiment, and mode of operation of the present invention have been described in the foregoing specification. This invention is not to be construed as limited to the particular forms disclosed, since these are regarded as illustrative rather than restrictive. Moreover, variations and changes may be made by those skilled in the art without departing from the spirit of the invention.

We claim:

1. A method of isolating a defect in an integrated circuit device, comprising the steps of:
    defining a fault dictionary of faults anticipated from specific scan patterns applied to a design simulation of an integrated circuit device using scan test vectors which are included in said fault dictionary said faults included predefined faults and failures from the design simulation of the integrated circuit device;
    testing the integrated circuit device with said scan test vectors;
    collecting outputs from the integrated circuit device, the outputs generated by said scan test vectors testing the integrated circuit device;
    mapping said scan test vectors, which cause incorrect outputs from the integrated circuit device, with corresponding ones of said outputs from the integrated circuit device into simulation scan patterns;
    performing, in response to said simulation scan patterns, a scan integrity test of sequential circuitry defining a scan chain in the integrated circuit device and, if the scan integrity test fails, probing the scan chain to isolate the fault;
    if the scan integrity test passes, providing said simulation scan patterns to a diagnostic software program simulator;
    creating, by said diagnostic software program simulator, a list of suspect faults in combinational logic of the integrated circuit device, based on said simulation scan patterns, to localize possible fault candidates in the integrated circuit device;
    if the list of suspect faults is sufficiently small, probing a selected area of the combinational logic of the integrated circuit device to determine the location of the fault in the combinational logic;
    if the list of suspect faults is not sufficiently small, creating additional scan test vectors so as to further localize possible fault candidates in the integrated circuit device; and
    retesting the integrated circuit device with said additional scan test vectors.

2. The method of claim 1 wherein the step of probing the integrated circuit device is done with an electron beam prober.

3. An integrated circuit device defect isolation testing apparatus, comprising:
    means for storing a fault dictionary of faults anticipated from specific scan patterns applied to a design simulation of an integrated circuit device, including predefined faults and failures from the design simulation of the integrated circuit device using said scan test vectors;
    means for testing the integrated circuit device with said scan test vectors from said fault dictionary;
    means for collecting outputs from the integrated circuit device, the outputs generated by said scan test vectors testing the integrated circuit device;
    means for mapping said scan test vectors, which cause incorrect outputs from the integrated circuit device, with corresponding ones of said outputs from the integrated circuit device into simulation scan patterns;
    means for performing, in response to said simulation scan patterns, a scan integrity test of sequential circuitry defining a scan chain in the integrated circuit device and, if the scan integrity test fails, means for probing the scan chain to isolate the fault;
    if the scan integrity test passes, providing said simulation scan patterns to a diagnostic software program simulator;
    means for creating, by said diagnostic software program simulator, a list of suspect faults in combinational logic of the integrated circuit device based on said simulation scan patterns to localize possible fault candidates in the integrated circuit device;
    if the list of suspect faults is sufficiently small, means for probing a selected area of the combinational logic of the integrated circuit device to determine the location of the fault in the combinational logic;
    if the list of suspect faults is not sufficiently small, means for creating additional scan test vectors so as to further localize possible fault candidates in the integrated circuit device; and means for retesting the integrated circuit device with said additional scan test vectors.

4. The apparatus of claim 3, wherein the means for probing is an electron beam prober.

* * * * *